(12) United States Patent
Lee et al.

(10) Patent No.: US 6,642,136 B1
(45) Date of Patent: Nov. 4, 2003

(54) METHOD OF MAKING A LOW FABRICATION COST, HIGH PERFORMANCE, HIGH RELIABILITY CHIP SCALE PACKAGE

(75) Inventors: Jin Yuan Lee, Hsin-chu (TW); Ming Ta Lei, Hsin chu (TW); Ching-Cheng Huang, Hsinchu (TW); Chuen-Jye Lin, Ta-Tu Hsiang Taichung (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 09/953,525

(22) Filed: Sep. 17, 2001

(51) Int. Cl.$^7$ ................................................ H01L 21/44
(52) U.S. Cl. ........................................ 438/613; 438/106
(58) Field of Search ........................ 438/106–112, 612, 438/613; 257/738

(56) References Cited

U.S. PATENT DOCUMENTS

| | | | |
|---|---|---|---|
| 5,879,964 A | 3/1999 | Paik et al. | 438/113 |
| 6,107,180 A | 8/2000 | Munroe et al. | 438/613 |
| 6,159,837 A * | 12/2000 | Yamaji et al. | 438/613 |
| 6,181,569 B1 | 1/2001 | Chakravorty | 361/761 |
| 6,287,893 B1 * | 9/2001 | Elenius et al. | 438/108 |
| 6,372,619 B1 * | 4/2002 | Huang et al. | 438/597 |
| 2001/0000080 A1 * | 3/2001 | Nozawa | 438/613 |
| 2001/0040290 A1 * | 11/2001 | Sakurai et al. | 257/737 |

* cited by examiner

Primary Examiner—Steven Loke
Assistant Examiner—Douglas W. Owens
(74) Attorney, Agent, or Firm—George O. Saile; Stephen B. Ackerman

(57) ABSTRACT

A new method and chip scale package is provided. A point of electrical contact over a substrate is exposed through an opening created through overlying layers of passivation and polymer or elastomer, deposited over the substrate. A barrier/seed layer is deposited. A first photoresist mask exposes the barrier/seed layer where this layer overlies and is adjacent to the contact pad. The exposed surface of the barrier/seed layer is electroplated. The first photoresist mask is removed, a second photoresist mask is created to define the solder bump exposing a surface area of the barrier/seed layer not overlying the contact pad. The solder bump is created, the second photoresist mask is removed. The exposed barrier/seed layer is etched in accordance with the electroplating, reflow of the solder bump is optionally performed.

36 Claims, 5 Drawing Sheets

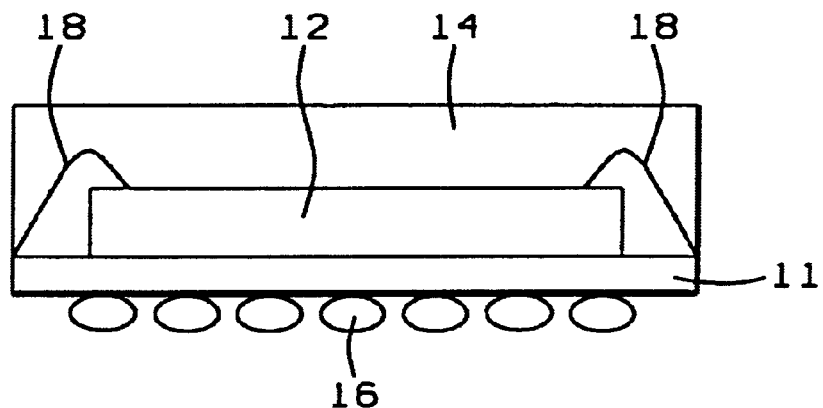
FIG. 1 - Prior Art
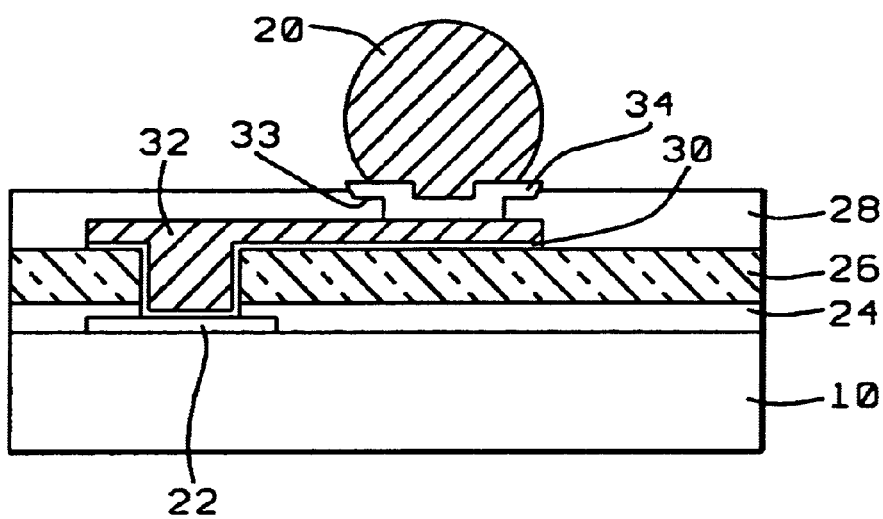
FIG. 2 - Prior Art

METHOD OF MAKING A LOW FABRICATION COST, HIGH PERFORMANCE, HIGH RELIABILITY CHIP SCALE PACKAGE

BACKGROUND OF THE INVENTION (1) Field of the Invention

The invention relates to the fabrication of integrated circuit devices, and more particularly, to a method and package for semiconductor devices.

(2) Description of the Prior Art

The creation of semiconductor devices, also referred to as Integrated Circuits (IC), has been made possible by the rapid development of supporting technologies such as photolithography and methods of etching. Most of these technologies have over the years addressed concerns created by a continued decrease in device dimensions and increase in device densities. This effort of creating improved performance devices is not limited to the impact on the semiconductor device but extends into the methods and packages that are used to further interconnect semiconductor devices and to protect these devices from environmental damage. This latter issue has created a packaging technology that is also driven by demands of device miniaturization and the denser packaging of devices, demands that must be met at no penalty to device performance and in a cost-effective manner.

Semiconductor device packaging typically mounts a device on a substrate, such as semiconductor substrates, printed circuit boards, flex circuits, metallized substrates, glass substrates and semiconductor device mounting support. Such a substrate can be a relative complex structure, having multiple layers of interconnect metal distributed throughout the height of the substrate in addition to having interconnect traces created on one or both surfaces of the substrate. In addition, in order to enable the mounting of semiconductor over the surface of the substrate, contact pads such as bond pads are typically provided over at least one of the surfaces of a substrate. For more complex packages, several levels of packaging may be applied whereby a semiconductor device is mounted on a substrate and connected to interconnect metal that is part of the substrate. The first level substrate may be further mounted over the surface of a larger substrate from which the device is interconnected to surrounding circuitry or electrical components. Limitations that are imposed on this method of packaging are typically limitations of electrical performance imposed on the device by the packaging interface. For instance, of key concern is RC delay incurred in the transmission of signals over the various interconnect traces. This places a restraint on the size and therefore on the packaging density on the package. Also of concern are considerations of parasitic capacitance and inductance that are introduced by the package since these parameters have a negative impact on device performance, a more serious impact on high frequency device performance. These parasitic components must therefore be minimized or suppressed to the maximum extent possible.

One or the more conventional methods of connecting a semiconductor device to surrounding points of interconnect is the use of a solder bump. Typically a semiconductor device will be provided on the active surface of the device with points of electrical interconnect, which electrically access the device. To connect these points of interconnect to for instance a printed circuit board, solder bumps are provided on the surface of the circuit board that align with the points of electrical contact of the device. The creation of this interface is also subject to requirements that are imposed by electrical performance of the completed package, by requirements of package miniaturization, reliability, cost performance and the like. The invention provides a package that addresses these packaging concerns in addition to others.

U.S. Pat. No. 6,181,56.9 (Charkravorty) shows a solder bump process and structure that includes trace formation and bump plating.

U.S. Pat. No. 6,107,180 (Munroe et al.) shows a bump process using UBM and solder bumps.

U.S. Pat. No. 5,879,964 (Paik et al.) shows a related bump and interconnect process.

SUMMARY OF THE INVENTION

A principle objective of the invention is to provide a high-pillar solder bump that sustains a high stand-off of the complete solder bump while maintaining high bump reliability and minimizing damage caused by mismatching of thermal stress factors between the interfacing surfaces.

Another objective of the invention is to provide a method that further improves bump reliability by reducing mechanical and thermal stress.

Yet another objective of the invention is to provide re-distribution bumps which enable the creation of a flip-chip package without requiring a change in the design of the Integrated Circuit and without modifying the pad pitch, the performance of the package is improved and the package size does not need to be modified.

A still further objective of the invention is to provide a chip scale package using one UBM layer of metal, significantly reducing costs of fabrication and materials.

A still further objective of the invention is to provide a chip scale package whereby the solder ball is removed from the semiconductor device, eliminating the need for low-alpha solder, thus reducing fabrication cost and concerns of soft-error occurrence.

A new method and chip scale package is provided. A point of electrical contact over a substrate is exposed through an opening created through overlying layers of passivation and polymer or elastomer, deposited over the substrate. A barrier/seed layer is deposited. A first photoresist mask exposes the barrier/seed layer where this layer overlies and is adjacent to the contact pad. The exposed surface of the barrier/seed layer is electroplated. The first photoresist mask is removed, a second photoresist mask is created to define the solder bump exposing a surface area of the barrier/seed layer not overlying the contact pad. The solder bump is created, the second photoresist mask is removed. The exposed barrier/seed layer is etched in accordance with the electroplating, reflow of the solder bump is optionally performed.

BRIEF DESCRIPTION OF THE DRAWINGS

FIG. 1 shows a cross section of a conventional mini-BGA package.

FIG. 2 shows a cross section of a conventional re-routing bump.

FIG. 3 shows a cross section of a silicon substrate, a top metal contact pad has been provided, a layer of passivation and a layer of polymer or elastomer have been deposited and patterned over the surface of the BGA substrate.

FIG. 4 shows a cross section after a barrier/seed layer has been deposited.

FIG. 5 shows a cross section after a first photoresist mask has been created over the surface of the barrier/seed layer, electroplating has been applied for the deposition of metal for the formation of interconnect traces.

FIG. 6 shows a cross section after the first photoresist mask has been removed from the surface of the barrier/seed layer.

FIG. 7 shows a cross section-after a second photoresist mask has been created over the surface of the barrier/seed layer, including the surface of the electroplated interconnect metal; the second photoresist mask defines the solder bump.

FIG. 8 hows a cross section after the solder bump has been electroplated in accordance with the second photoresist mask.

DESCRIPTION OF THE PREFERRED EMBODIMENTS

Figure 3:
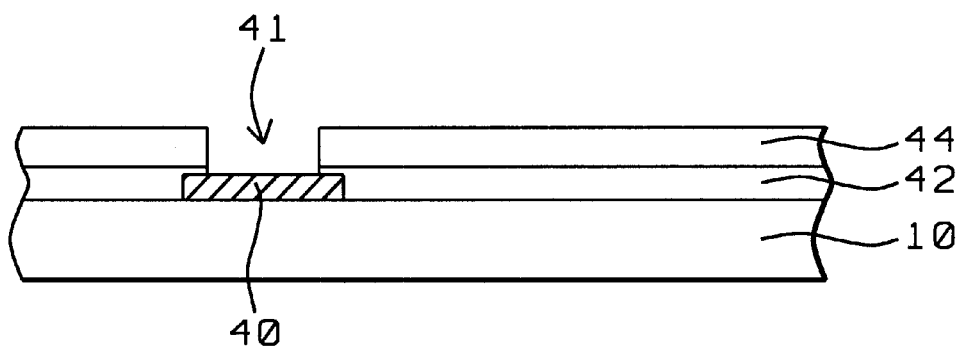
FIGS. 3 through 8 detail the process flow of the invention, as follows.

Two prior art applications are shown in the cross sections of FIGS. 1 and 2, specifically in the cross section of FIG. 1 are shown:

11, a BGA substrate such as a printed circuit board and the like 12, a semiconductor device or die 14, a molding compound that is used to encapsulate the die 12

16, solder balls that form the electrical interface between the package shown in cross section in FIG. 1 and surrounding circuitry; these solder balls can for instance be further connected to contact pads on the surface of a Printed Circuit Board (PCB)

18, bond wires used to connect points of electrical contact (not shown) on the active surface of die 12 with contact pads (not shown) on the second or upper surface of BGA substrate 11.

FIG. 2 shows a cross section of a conventional re-routing bump, the re-routing applies since the solder bump that is shown in cross section in FIG. 2 does not align with the contact pad with which the solder bump is connected. The elements that are highlighted in the cross section of FIG. 2 are the following:

10, a device supporting silicon substrate 20, a solder ball 22, top metal contact point 24, a layer of passivation, applied for the protection of the underlying surface and the surface of the layer 22 of top metal 26, a layer of dielectric material 28, a layer of passivation, applied for the protection of the underlying layer 26 of dielectric and the surface of the layer 32 of re-routing metal 30, a seed and/or barrier layer 32, a patterned layer of re-routing metal 33, a seed layer, and 34, a layer of UBM metal.

FIGS. 3 through 9 will now be used to describe the invention. Referring specifically to the cross section that is shown in FIG. 3, there is shown:

10, a semiconductor supporting surface such as the surface of a silicon substrate 40, a contact pad or top metal pad that has been provided in or on substrate 10

42, a layer of passivation deposited over supporting surface 10; the layer 42 of passivation has been patterned, creating opening 41 through the layer 42 of passivation that aligns with the contact pad 40

44, a layer of polymer or elastomer deposited over the layer 42 of passivation; the layer 44 of polymer or elastomer has been patterned, creating opening 41 through the layer 42 of polymer or elastomer that aligns with the contact pad 40. Contact pad 40 can comprise aluminum or copper or a compound thereof.

As materials that can be used as a polymer for the deposition of layer 44 can be cited polyimide, parylene or teflon, electron resist, solid organics or inorganics, BCB (bisbenzocyclobutene), PMMA (poly-methyl-methacrylate), teflon which is a polymer made from PTFE (polytetrafluoroethylene), also polycarbonate (PC), polysterene (PS), polyoxide (PO) and poly polooxide (PPO).

The semiconductor supporting surface 10 can be semiconductor substrates, printed circuit boards, flex circuits, metallized substrates, glass substrates and semiconductor device mounting support, whereby the semiconductor substrate can selected from the group of substrates consisting of semiconductor substrates, ceramic substrates, glass substrates, gallium arsenide substrates, silicon on insulator (SOI) substrates and silicon on sapphire (SOS) substrates.

Figure 4:
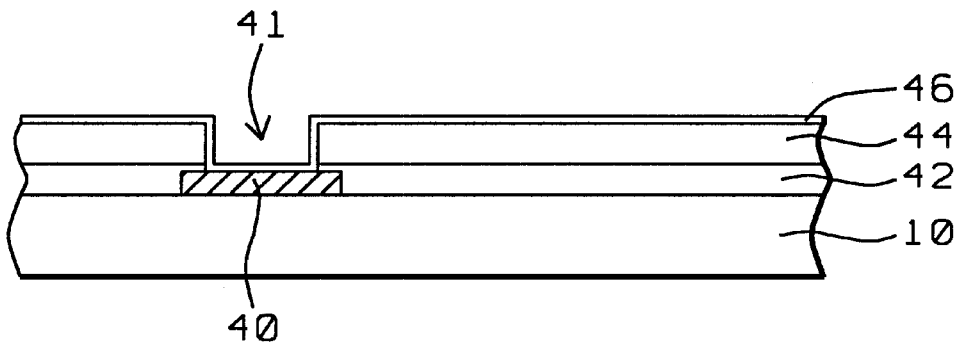

FIG. 4 shows a cross section of the semiconductor substrate 10 after a layer 46 of barrier/seed material has been deposited over layer 44 of polymer or elastomer; inside surfaces of opening 41 have also been covered with the layer 46 of barrier/seed material.

A typical barrier layer 46 is deposited using rf. sputtering of titanium nitride, tantalum, tungsten, niobium, molybdenum, Ti/TiN or Ti/W and is more preferably formed from TiN. The barrier layer 46 can also be used to improve the adhesion of overlying metal layers. A barrier layer is preferably between about 100 and 1,000 Angstroms thick.

To further enhance the adhesion of a copper interconnect line to the surrounding layer of dielectric or insulation, a seed layer is deposited over the barrier layer. A seed layer can be deposited using a sputter chamber or an Ion Metal Plasma (IMP) chamber at a temperature of between about 0 and 300 degrees C. and a pressure of between about 1 and 100 mTorr, using copper or a copper alloy as the source at a flow rate of between about 10 and 400 sccm and using argon as an ambient gas. The minimum thickness of a seed layer is about 5,000 Angstrom, this thickness is required achieve a reliable gap fill.

Figure 5:
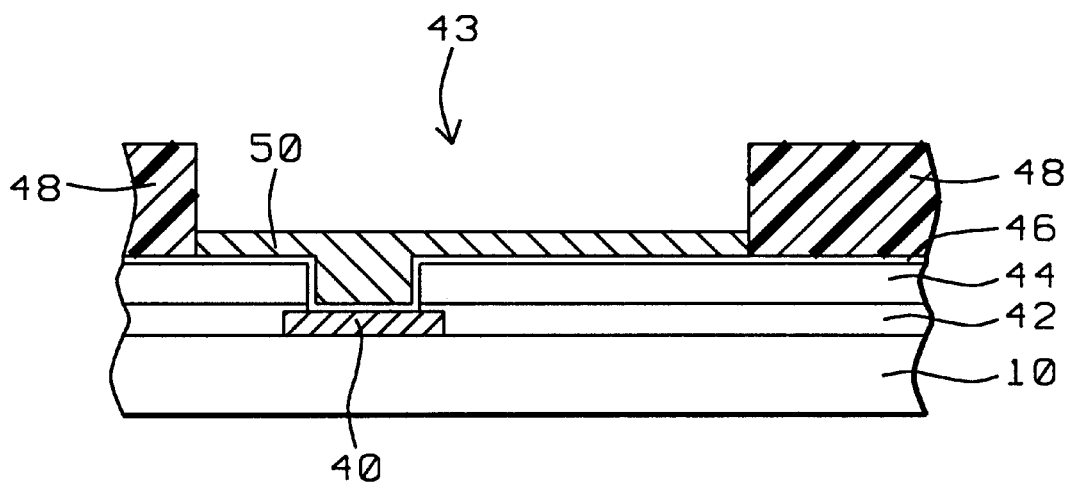

FIG. 5 shows a cross section after:

48, a first photoresist mask has been formed over the surface of barrier/seed layer 46, exposing the surface of the barrier/seed layer 46 through opening 43, and 50, a layer 50 of metal has been deposited over the exposed surface of the barrier/seed layer 46 in accordance with the opening 43 created through the first photoresist mask 48.

The process of deposition and patterning a layer of photoresist uses conventional methods of photolithography and masking. Layer 48 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained. The opening 43 that is in this manner created in the layer 48 of photoresist exposes the surface of the layer 44 of barrier/seed material over a surface area where re-routing metal has to be created.

Figure 6:
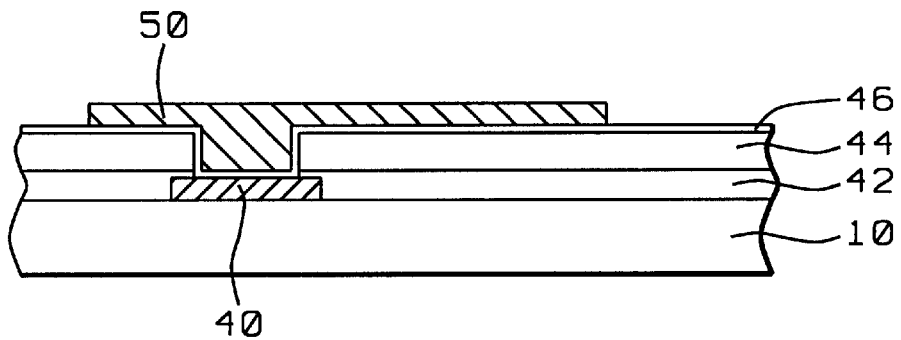

Removal of the first photoresist mask 48 from the surface of the barrier/seed layer 46 results in the cross section that is shown in FIG. 6.

Figure 7:
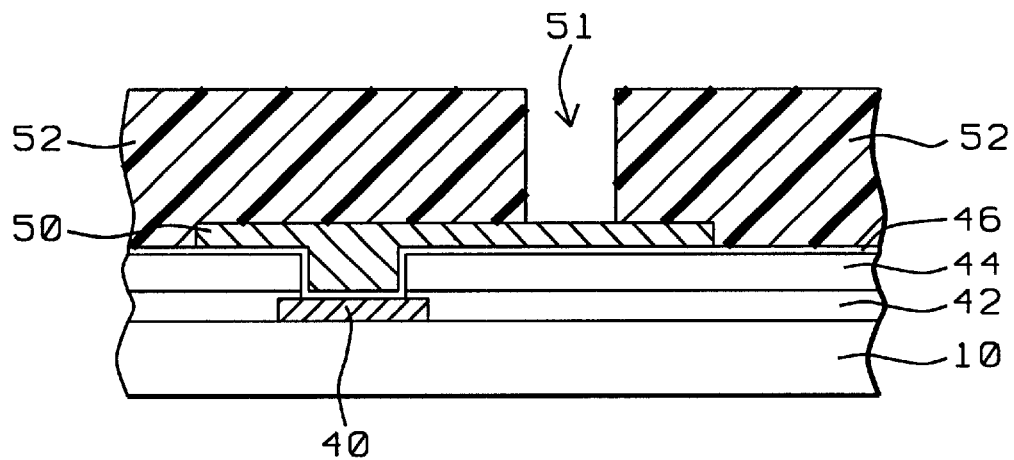

The invention continues with the cross section that is shown in FIG. 7, shown are:

52, a second photoresist mask created over the barrier/seed layer 46, including the interconnect metal layer 50, and 51, an opening created through the second layer 52 of photoresist, exposing layer 50 of interconnect metal; opening 51 defines the location and the size (diameter) of the bump.

Figure 8:
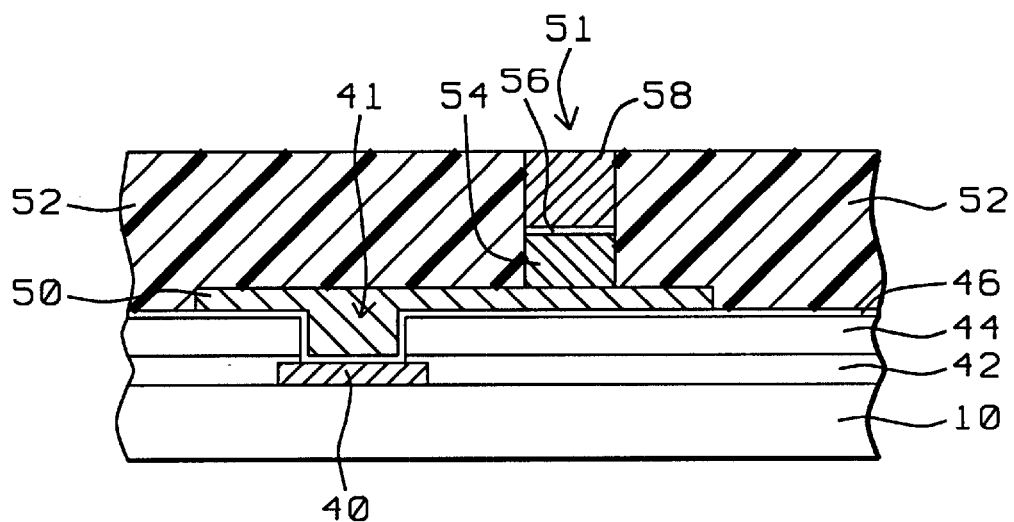

The cross section that is shown in FIG. 8 is after the opening 51 created in the second layer of dielectric has been filled with solder bump material. These materials can be selected as:

layer 54 being a first layer of metal, typically comprising copper, deposited to a thickness between about 10 and 100 µm, and more preferably to a thickness of about 50 µm layer 56 being an UBM layer, typically comprising nickel, deposited to a thickness between about 1 and 10 µm, and more preferably to a thickness of about 5 µm, forming an integral part of the pedestal of the to be created interconnect bump, and layer 58 is a layer of solder compound, deposited to a thickness between about 10 and 100 µm, and more preferably to a thickness of about 50 µm.

With the completion of the electroplating of these three layers, the solder bump is essentially complete. The second solder mask 52, FIG. 8, is therefore removed from the surface of the barrier/seed layer 46 and the surface of the interconnect metal 50, see FIG. 9, exposing the barrier/seed layer 46 and the interconnect metal 50, the pattern of interconnect metal 50 overlying the barrier/seed layer 46.

It is good practice and can be of benefit in the creation of the layers 54, 56 and 58 of metal to perform, prior to the electroplating of these layers of metal, an in-situ sputter clean of the exposed surface (exposed through opening 51) of the layer 50 of re-routing metal.

Figure 9:
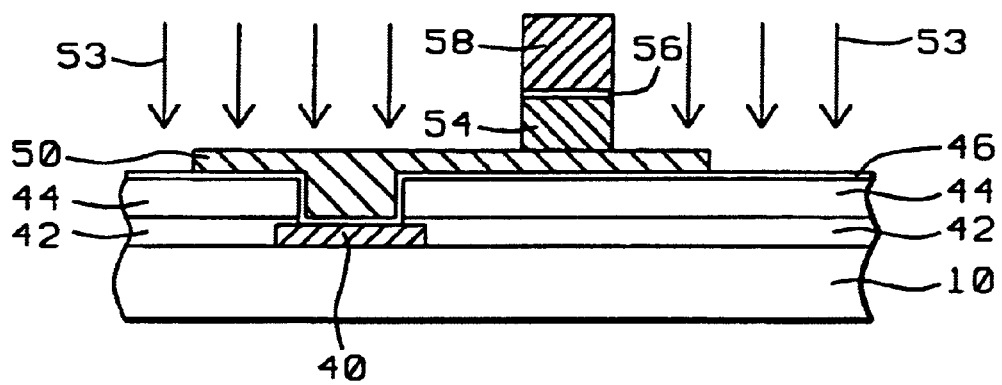
FIG. 9 shows a cross section after removal of the second photoresist mask, exposing the surface of the barrier/seed layer and the electroplated interconnect metal.
Figure 10:
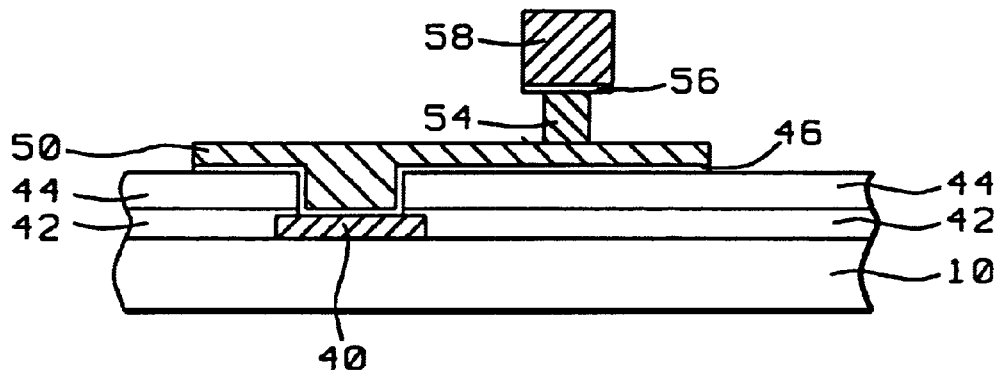
FIG. 10 shows a cross section after the barrier/seed layer has been etched in accordance with the layer of interconnect metal.

The barrier/seed layer 46 can now be etched by applying etch 53, FIG. 9, to the barrier/seed layer 46, using the patterned layer 50 of interconnect metal as a mask, which leads to the cross section that is shown in FIG. 10.

It is further good practice to oxidize the surface of the UBM and pillar metal by chemical or thermal oxidation. The chemical oxidation could be an $H_2O_2$ oxidation process, at a temperature in excess of about 150 degrees C. These processing steps can further help prevent wetting of the solder bump to the metal traces.

Reflow can optionally be applied the layer 58 of solder compound, creating a spherical layer 58 of solder which forms the solder bump (not shown). It must be noted in the cross section that is shown in FIG. 10 that the diameter of the UBM layer 54 is, during and as a consequence of the etching of the barrier/seed layer 46, reduced in diameter. This allows the solder ball 58 to be removed from the surface of the substrate by a relatively large distance. From this follows the advantage that it is no longer required that low-alpha solder is used for the solder compound of solder ball 58 reducing manufacturing cost in addition to reducing concerns of memory soft-error conditions.

Layer 56 of UBM may contain multiple layers of metal such as a layer of chrome, followed by a layer of copper, followed by a layer of gold. From the latter it is apparent that layer 56 of UBM may comprise several layers of metal that are successively deposited.

Figure 11:
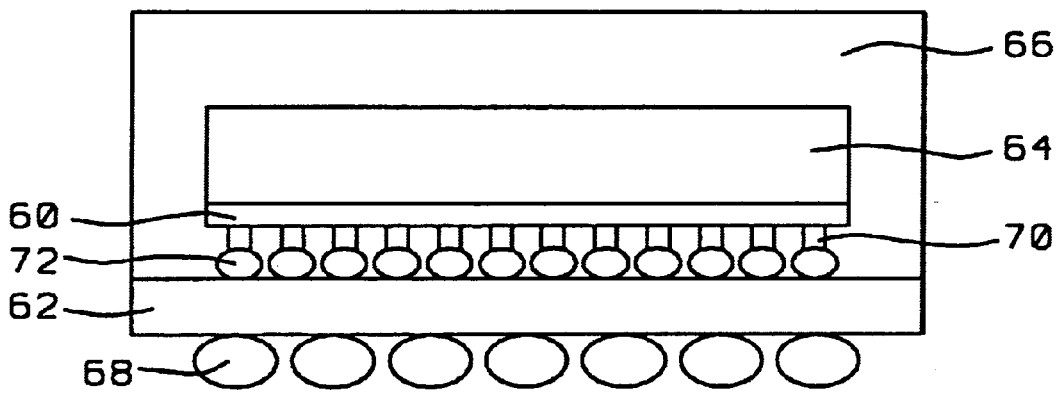
FIG. 11 shows a cross section of the package of the invention with a molding compound as encapsulant.
Figure 12:
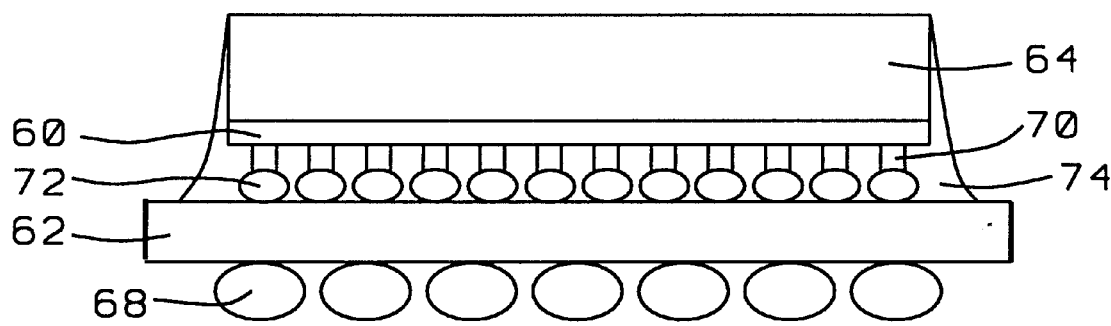
FIG. 12 shows a cross section of the package of the invention with underfill as encapsulant.

Examples of the application of the package of the invention are shown in cross section.in FIGS. 11 and 12. Highlighted in FIG. 11 are:

60, a polymer or elastomer layer provided by the invention, similar to layer 44 of FIG. 3 e.a.

62, a BGA substrate over which a semiconductor device is to be mounted 64, a semiconductor device 66, a molding compound applied to encapsulate the device 64

68, contact balls to the package of the invention 70, pillar metal, similar to layers 54 and 56 of FIG. 8 e.a., and 72, a solder bump, similar to layer 58 of FIG. 8 after thermal reflow has been applied to this layer.

Shown in cross section in FIG. 12 is another application of the invention. The elements that have been applied above under FIG. 11 are valid for the cross section shown in FIG. 12 with the exception of element 74, which in the cross section of FIG. 12 is an underfill that has been applied under semiconductor device 64 and that replaces layer 66 of molding compound in FIG. 11 as the means for encapsulating the device 64.

Figure 13:
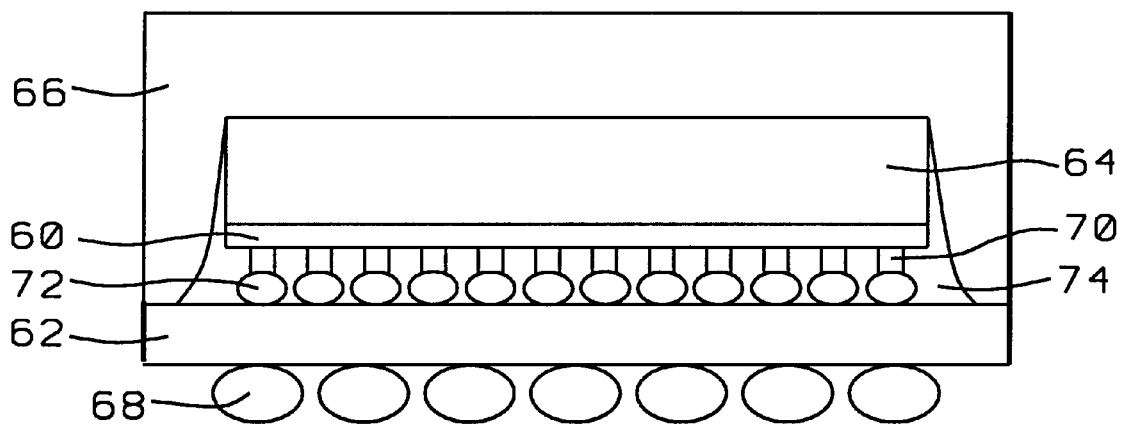
FIG. 13 shows a cross section of the package of the invention using both molding and an underfill.
Figure 14:
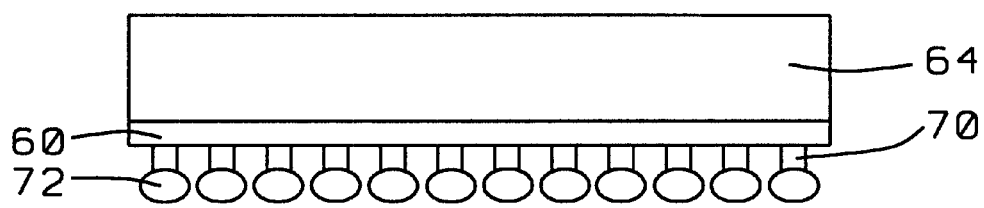
FIG. 14 shows a cross section of the package of the invention as a bare die that can be directly attached to a next level substrate.

FIGS. 13 and 14 show additional applications of the invention with FIG. 13 showing a cross section of the package of the invention using both molding and an underfill while FIG. 14 shows a cross section of the package of the invention as a bare die that can be directly attached to a next level substrate. All elements of the cross sections that are shown in FIGS. 13 and 14 have previously been described and need therefore not been further highlighted at this time.

In order to better highlight the differences between the prior art solder bump, as shown in cross section in FIG. 2, and the solder bump of the invention, as shown in the cross section of FIG. 10, the processing steps to create these two solder bumps are listed below. These steps are easier to follow if it is realized that both methods require and apply two metal fill plating steps, the first of these two step is to create a patterned layer of re-routing metal, the second is to create the solder bump. The processing sequences are as follows:

1. the prior art starts with a device support substrate, a contact pad has been created over the surface of the substrate, layers of passivation and dielectric have been deposited over the surface of the substrate and patterned to expose the contact pad; the invention starts with the same structure
2. the prior art deposits a first seed layer over the surface of the layer of dielectric; the invention does the same
3. the prior art performs a first metal fill over the first seed layer by creating a layer of metal that serves as re-routing metal; the invention does the same
4. the prior art etches the first seed layer; the instant invention does not perform this step at this time
5. the prior art deposits and patterns a layer of passivation, exposing the surface of the layer of re-routing metal, the patterned second layer of passivation serves as a mask for the reflow of the solder bump; the instant invention does not perform this step because the solder bump structure will not wet to the re-routing metal
6. the prior art deposits a second seed layer over the surface of the layer of passivation; the instant invention does not deposit a second seed layer
7. the prior art plates a layer of UBM over which a layer of solder compound is plated; the instant invention deposits a layer of UBM and two metal plating steps, the first metal plating step plating a layer of metal, such as copper or nickel that forms an integral part of the pedestal of the to be created interconnect bump, the second metal plating step depositing a solder compound
8. the prior art performs reflow of the solder compound; the instant invention does the same
9. the prior art etches the second seed layer using the solder ball as a mask; the instant invention etches the first seed layer using the patterned re-routing metal as a mask.

The essential differences between the prior art and the instant invention is provided by the two plating steps and can, for easy reference be summarized as follows:

| Prior Art | Instant Invention |
|---|---|
| First plating step | |
| 1st seed layer dep. | 1st seed layer dep. |
| plate re-routing metal | plate re-routing metal |
| etch 1st seed layer | (no equivalent step) |
| Second plating step | |
| 2st seed layer dep. | (no equivalent step) |
| plate UBM + solder | plate UBM + metal + solder |
| etch 2st seed layer | etch 1st seed layer |

The advantages of the instant invention can be summarized as follows:
1. the height of the metal pillar (layers 54 and 56, FIG. 10) allows for high stand-off between the surface of substrate 10, thereby reducing impact of mismatching of thermal fatigue between interfacing surfaces such as the surface of the substrate 10 and the layers of metal that are part of the solder bump
2. the layer 44 has been highlighted as being a layer of or polymer or elastomer and is selected for its ability to provide stress release between overlying surfaces and thus to enhance solder bump reliability
3. the re-distribution solder bump of the invention allows for creating a flip-chip package without the need for semiconductor device redesign or changes in the pitch of the contact points of the package (the pitch of contact balls 72 and 68, FIGS. 11 and 12); the package size can also remain constant while still being able to package die of different dimensions (due to the flexibility of the routing of the re-routing metal layer 50, FIG. 50, FIG. 10)
4. the method of creating the solder pillar and the solder bump, that is plating a layer of UBM over which metal is plated twice, contributes a significant cost saving in both materials used and in the manufacturing cost; the need for separate UBM plating and etching, for separate plating and etching the pillar metal and for separate plating and etching the solder compound is reduced to using one photoresist mask that is applied for all three steps
5. by creating a relatively high layer of pillar metal, the solder ball is removed from the surface of the substrate; from this follows that low-alpha solder is no longer required as a solder compound for the solder bump, reducing manufacturing costs; from this further follows that soft-error concerns that typically apply to memory chip designs are less valid using the solder bump of the invention
6. by creating a relatively high layer of pillar metal, the solder ball of the instant invention will not wet to the re-routing metal trace. Thus, the second layer of passivation material, which typically serves as a solder mask, is no longer required and, consequently, processing cost is reduced.

In sum: the invention provides a method to create a solder bump having a high metal pillar and a solder ball. Seed/barrier layer deposition is limited to one deposition, a first metal plating step defines the re-routing metal, a second metal plating step creates the solder bump. The need for additional layers of passivation or solder mask has been removed.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a re-routed metal bump on a semiconductor surface, comprising the steps of:
   providing a semiconductor surface, at least one contact pad having been provided in or over said semiconductor surface, said at least one contact pad being exposed by at least one opening created through a layer of passivation deposited over the semiconductor surface and through a layer of dielectric deposited over said layer of passivation;
   depositing a layer of conductive material over said layer of dielectric;
   performing a first plating over said layer of conductive material aligned with said at least one contact pad, creating a layer of re-routing metal;
   performing a second plating over said layer of re-routing metal, creating a solder bump comprising pillar metal having a diameter and a solder compound over said re-routing metal; and
   etching said layer of conductive material, using said layer of re-routing metal as a mask, simultaneously reducing a diameter of said pillar metal by an amount.

2. The method of claim 1, said layer of conductive material comprising a material selected from the group of materials consisting of barrier layer material and seed layer material.

3. The method of claim 1, said performing a first plating over of said layer of conductive material comprising the steps of:

forming a first metal deposition mask over said layer of conductive material, said first metal deposition mask exposing said layer of conductive material over an area that aligns with said at least one contact pad and, contiguous therewith, over an area adjacent to said at least one contact pad and emanating in one direction from said at least one contact pad;

first electroplating a first layer of metal over said layer of conductive material in accordance with said first metal deposition mask, said first electroplating creating a layer of re-routing metal over said layer of conductive material; and removing said first metal deposition mask from said layer of conductive material.

4. The method of claim 3, said first metal deposition mask comprising photoresist.

5. The method of claim 1, said performing a second plating over said layer of re-routing metal comprising the steps of:

forming a second metal deposition mask over said layer of re-routing metal, said second metal deposition mask exposing said re-routing metal over said surface area of said re-routing metal that is adjacent to said at least one contact pad and emanating in one direction from said at least one contact pad;

second electroplating a second layer of metal over said layer of re-routing metal in accordance with said second metal deposition mask, said second electroplating creating a layer of pillar metal over said re-routing metal after which a layer of solder compound is electroplated over said pillar metal; and removing said second metal deposition mask from said re-routing metal, exposing said layer of conductive material and said re-routing metal.

6. The method of claim 5, said second metal deposition mask comprising photoresist.

7. The method of claim 5, said pillar metal comprising a layer of metal created over said re-routing metal and a layer of Under Bump Metallurgy (UBM) electroplated over said layer of metal.

8. The method of claim 7, said layer of UBM comprising nickel applied to a thickness of between about 1 and 10 $\mu$m.

9. The method of claim 7, said layer of metal comprising copper applied to a thickness of between about 10 and 100 $\mu$m.

10. The method of claim 7, said layer of Under Bump Metallurgy comprising a plurality of sub-layers of different metallic composition.

11. The method of claim 5, said layer of solder compound comprising solder applied to a thickness of between about 30 and 100 $\mu$m.

12. The method of claim 1, said semiconductor surface being selected from the group of surfaces consisting of silicon semiconductor substrates, printed circuit boards, flex circuits, metallized substrates, glass substrates and semiconductor device mounting support.

13. The method of claim 12, said semiconductor substrate being selected from the group of substrates consisting of silicon semiconductor substrates, ceramic substrates, glass substrates, gallium arsenide substrates, silicon on insulator (SOI) substrates and silicon on sapphire (SOS) substrates.

14. The method of claim 1, wherein said at least one contact pad is aluminum, copper or a compound thereof.

15. The method of claim 1, further comprising performing an in-situ sputter clean of said layer of conductive material, said additional step being performed prior to said performing a second plating over said layer of re-routing metal.

16. The method of claim 1, said layer of dielectric being selected from the group of materials consisting of polymer and elastomer.

17. A method for forming a metal bump on a semiconductor surface, comprising the steps of:

providing a semiconductor surface, at least one contact pad having been provided in or over said semiconductor surface, a layer of passivation having been deposited over said semiconductor surface, a layer of dielectric having been deposited over said layer of passivation, said layers of dielectric and passivation having been patterned and etched creating at least one opening through said layers of dielectric and passivation, said at least one opening through said layers of dielectric and passivation being aligned with said at least one contact pad, exposing said at least one contact pad;

depositing a layer of conductive material over said layer of dielectric, including said at least one contact pad, said layer of conductive material comprising a material selected from the group consisting of barrier layer material and seed layer material;

forming a first metal deposition mask over said layer of conductive material, said first metal deposition mask exposing said layer of conductive material over a surface area that aligns with said at least one contact pad and, contiguous therewith, over a surface area that is adjacent to said at least one contact pad and emanating in one direction from said at least one contact pad;

first electroplating a first layer of metal over said layer of conductive material in accordance with said first metal deposition mask, said first electroplating creating a layer of re-routing metal over said layer of conductive material;

removing said first metal deposition mask from said layer of conductive material;

forming a second metal deposition,mask over said layer of re-routing metal, said second metal deposition mask exposing said layer of re-routing metal over said surface area of said layer of re-routing metal that is adjacent to said at least one contact pad and emanating in one direction from said at least one contact pad;

second electroplating a second layer of metal over said layer of re-routing metal in accordance with said second metal deposition mask, said second electroplating creating a layer of pillar metal over said re-routing metal after which a layer of solder compound is electroplated over said pillar metal;

removing said second metal deposition mask from said layer of re-routing metal, exposing said layer of conductive material and said re-routing metal; and etching said layer of conductive material using said layer of re-routing metal as a mask, simultaneously reducing a diameter of said second electroplated pillar metal by an amount.

18. The method of claim 17, said first metal deposition mask comprising photoresist.

19. The method of claim 17, said second metal deposition mask comprising photoresist.

20. The method of claim 17, said pillar metal comprising a layer of metal created over said re-routing metal and a layer of Under Bump Metallurgy (UBM) electroplated over said layer of metal.

21. The method of claim 20, said layer of UBM comprising nickel applied to a thickness of between about 1 and 10 μm.

22. The method of claim 20, said second layer of metal comprising copper applied to a thickness of between about 10 and 100 μm.

23. The method of claim 20, said layer of Under Bump Metallurgy comprising a plurality of sub-layers of different metallic composition.

24. The method of claim 17, said layer of solder compound comprising solder applied to a thickness of between about 30 and 100 μm.

25. The method of claim 17, said semiconductor surface being selected from the group of surfaces consisting of semiconductor substrates, printed circuit boards, flex circuits, metallized substrates, glass substrates and semiconductor device mounting support.

26. The method of claim 25, said semiconductor substrate being selected from the group of substrates consisting of silicon semiconductor substrates, ceramic substrates, glass substrates, gallium arsenide substrates, silicon on insulator (SOI) substrates and silicon on sapphire (SOS) substrates.

27. The method of claim 17, said at least one contact pad comprising aluminum or copper or a compound thereof.

28. The method of claim 17, further comprising performing an in-situ sputter clean of said layer of re-routing metal, said additional step being performed prior to said second electroplating a second layer of metal over said layer or re-routing metal.

29. The method of claim 17, said layer of dielectric being selected from the group of material consisting of polymer and elastomer.

30. The method of claim 1, said pillar metal being oxidized by applying chemical or thermal oxidation.

31. The method of claim 17, said pillar metal being oxidized by applying chemical or thermal oxidation.

32. The method of claim 7, the UBM and pillar metal additionally being oxidized by chemical or thermal oxidation.

33. The method of claim 7, the UBM and pillar metal additionally being oxidized by chemical or thermal oxidation.

34. The method of claim 33, said additionally oxidizing being an $H_2O_2$ oxidation process, at a temperature in excess of about 150 degrees C.

35. The method of claim 20, the UBM and pillar metal additionally being oxidized by chemical or thermal oxidation.

36. The method of claim 35, said additionally oxidizing being an $H_2O_2$ oxidation process, at a temperature in excess of about 150 degrees C.

* * * * *